(12) United States Patent
Cohen et al.

(10) Patent No.: US 6,928,527 B2
(45) Date of Patent: Aug. 9, 2005

(54) LOOK AHEAD METHODS AND APPARATUS

(75) Inventors: Zeev Cohen, Safed (IL); Ran Dvir, Beit Yehoshua (IL); Eduardo Maayan, Kfar Saba (IL)

(73) Assignee: Saifun Semiconductors Ltd., Netanya (IL)

( * ) Notice: Subject to any disclaimer, the term of this patent is extended or adjusted under 35 U.S.C. 154(b) by 312 days.

(21) Appl. No.: 10/211,234

(22) Filed: Aug. 5, 2002

(65) Prior Publication Data

US 2003/0145188 A1 Jul. 31, 2003

Related U.S. Application Data

(60) Provisional application No. 60/352,587, filed on Jan. 31, 2002.

(51) Int. Cl.[7] .............................................. G06F 12/00
(52) U.S. Cl. ....................... 711/156; 711/154; 711/103; 714/723
(58) Field of Search ................................ 711/156, 154, 711/103, 118, 144; 714/723; 365/189.01, 189.04, 189.05, 189.07

(56) References Cited

U.S. PATENT DOCUMENTS

| | | | | |
|---|---|---|---|---|
| 5,696,929 A | * | 12/1997 | Hasbun et al. | ............... 711/103 |
| 6,000,006 A | * | 12/1999 | Bruce et al. | ................. 711/103 |
| 6,374,337 B1 | * | 4/2002 | Estakhri | ...................... 711/169 |
| 6,418,506 B1 | * | 7/2002 | Pashley et al. | ............. 711/103 |
| 6,633,956 B1 | * | 10/2003 | Mitani | ......................... 711/115 |
| 6,744,692 B2 | * | 6/2004 | Shiota et al. | ........... 365/230.03 |
| 2002/0004878 A1 | * | 1/2002 | Norman | ....................... 711/103 |
| 2002/0199065 A1 | * | 12/2002 | Subramoney et al. | ....... 711/137 |
| 2003/0131186 A1 | * | 7/2003 | Buhr | .......................... 711/103 |
| 2003/0145176 A1 | | 7/2003 | Dvir et al. | |
| 2003/0145188 A1 | | 7/2003 | Cohen et al. | |

OTHER PUBLICATIONS

Tanaka et al. "A Quick Intelligent Page–Programming Architecture and a Shielded Bitline Sensing Method for 3V–Only NAND Flash Memory", Nov. 1994, IEEE Journal of Solid–State Circuits, vol. 29, No. 11 p. 1366–1373.*

* cited by examiner

*Primary Examiner*—Mano Padmanabhan
*Assistant Examiner*—Paul Baker
(74) *Attorney, Agent, or Firm*—Eitan Law Group

(57) ABSTRACT

A method for operating a memory device, the method comprising marking a portion of a memory device associated with a group of bits comprising at least one bit upon which an operation is to be performed, and operating on the group of bits and skipping operating on at least one unmarked portion of the memory device in an operation cycle of the memory device. A random access memory (RAM) device is also disclosed comprising a plurality of addresses for storing therein data, and at least one address pointer for at least one of the addresses in the RAM device.

9 Claims, 5 Drawing Sheets

LOOK AHEAD METHODS AND APPARATUS

CROSS-REFERENCE TO RELATED APPLICATIONS

The present application claims priority from U.S. provisional application Ser. No. 60/352,587, filed Jan. 31, 2002, which is hereby incorporated by reference in its entirety.

FIELD OF THE INVENTION

The present invention relates generally to methods and apparatus for operating memory devices, and, particularly to methods and apparatus that enable looking ahead and searching for data in random access memories.

BACKGROUND OF THE INVENTION

Random access memories, such as static random access memories (SRAMs) or dynamic random access memories (DRAMs), generally comprise a multiplicity of addresses for writing therein data. FIG. 1 illustrates a demonstrative example of an SRAM 10. SRAM 10 may include, for purposes of example only and without limitation to these values, 66 addresses 12, each of which may store 64 bit words designated DATA(63,0). Data in the addresses may be accessed through data latches 14 for performing operations, e.g., programming, on a memory cell array (not shown). In the illustrated example, 64 data latches would be required.

Memory cell array may comprise non-volatile memory (NVM) cells, which store bits that may be programmed with program pulses. A "program pulse" is a set of voltages selected to bring the particular bit to a programmed state. A single programmed pulse may be insufficient to bring the bit to a programmed state. Moreover, in some cases, "leaping" to a programmed state with a single programming pulse may have adverse effects on functional reliability of the NVM cell. Accordingly, a plurality of programming pulses may be applied to program the bits of the NVM cells. However, this may pose a different problem with regard to accessing data from the SRAM 10, as is now explained.

In order to apply program pulses to the cells of the array, data is first retrieved from the SRAM 10. After each programming pulse applied to the array, "program verification" is performed, meaning that the bits are verified to check if they have attained a programmed state. Program verification also involves interrogation of the SRAM 10 in order to check which bits must be further programmed. Thus, a program cycle of, for example, 3 programming pulses, requires 6 passes over the entire SRAM. For the illustrated example that has 66 addresses, if the SRAM clock cycle is 50 nanoseconds (a typical value), then the total time spent on retrieving and writing=66×50 nsec×6=19.8 microseconds. This is a relatively long time and hampers performance of the SRAM 10 and array.

One known solution to speeding up the performance of the SRAM involves "look ahead", and is described with reference to FIG. 2. The method is based on the likelihood that not every address may comprise data that needs to be programmed in array. Valuable time may be saved if those addresses that do not require programming were to be skipped, thereby saving the double retrieve of data from SRAM 10. Accordingly, the method "looks ahead", i.e., searches, for the next data to be programmed while the previous data is being programmed. This may be accomplished with various control hardware and software. As seen in FIG. 2, the hardware may comprise address latches (or FFs) 18 and internal address control circuitry 20. In the illustrated example, since there are 66 addresses, which may be represented by 7 bits, 7 address FFs 18 are required.

The solution of FIG. 2 has several disadvantages. First, the additional hardware occupies valuable component space. Second, the look ahead search must be synchronized with the programming that is currently being performed, thereby complicating the control process. Third, the method only looks ahead in program, but not read.

SUMMARY OF THE INVENTION

The present invention seeks to provide improved methods and apparatus that enable looking ahead and searching for data in random access memories, while substantially simultaneously performing operations on previous data.

There is thus provided in accordance with an embodiment of the present invention a method for operating a memory device, the method comprising marking a portion of a memory device that comprises data associated with performance of an operation on a memory cell, and retrieving the data from the portion that is marked, and skipping retrieving data from at least one unmarked portion of the memory device in an operation cycle of the memory device.

In accordance with an embodiment of the present invention the marking comprises performing an operation on data in the memory device and marking the portion of the memory device in accordance with a result of the operation.

Further in accordance with an embodiment of the present invention the marking comprises marking a portion of a random access memory (RAM) device, the RAM device comprising a plurality of addresses for storing therein data.

Still further in accordance with an embodiment of the present invention the marking comprises marking a portion of the memory device associated with at least one of the addresses.

In accordance with an embodiment of the present invention the marking comprises providing at least one address pointer for each of the addresses in the RAM device, the at least one address pointer comprising bits, and marking the bits of the at least one address pointer.

Further in accordance with an embodiment of the present invention the marking comprises finding a first address, and proceeding to a second address and marking the at least one address pointer that corresponds to the second address with an identifier that identifies the first address.

Still further in accordance with an embodiment of the present invention the method comprises retrieving data only from those addresses that have marked address pointers.

In accordance with an embodiment of the present invention the method further comprises finding a first address that comprises data for operating on the memory cell, and proceeding to a second address and marking at least one address pointer, referred to as a verification pointer, which corresponds to the second address, with an identifier that identifies the first address.

Further in accordance with an embodiment of the present invention marking the verification pointer comprises providing the memory device with at least two address pointers for each of the addresses in the RAM device, wherein one of the address pointers is dedicated for indicating from which addresses data is to be retrieved, and another of the address pointers comprises the verification pointer.

There is also provided in accordance with an embodiment of the present invention a memory device comprising a random access memory (RAM) device comprising a plurality of addresses for storing therein data, and at least one address pointer for at least one of the addresses in the RAM device. A controller may be provided, which is adapted to mark bits in the at least one address pointer.

In accordance with an embodiment of the present invention the controller is adapted to scan the RAM device address by address.

Further in accordance with an embodiment of the present invention the RAM device communicates with an array comprising programmable bits, wherein the RAM device comprises a Boolean operation performable on binary integers 0 and 1 that designate a programmed state of a bit in the array (referred to as "ARRAY") and whether the RAM device includes programming instructions for the bit (referred to as "RAM"), wherein binary integer 0 indicates that the bit is programmed, and binary integer 1 indicates that the bit is not programmed.

Still further in accordance with an embodiment of the present invention the Boolean operation comprises a "complex mode" function comprising the Boolean operation ("RAM") OR (NOT "ARRAY").

Further in accordance with an embodiment of the present invention the Boolean operation comprises an "n-complex mode" function comprising the Boolean operation ("RAM") AND ("ARRAY").

BRIEF DESCRIPTION OF THE DRAWINGS

The present invention will be understood and appreciated more fully from the following detailed description taken in conjunction with the drawings in which.

DETAILED DESCRIPTION OF THE PREFERRED EMBODIMENT

Figure 1:
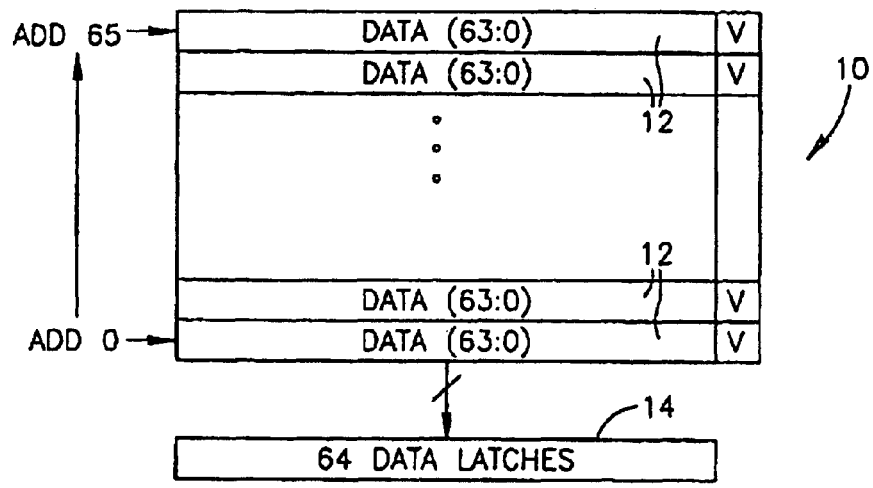
FIG. 1 is a simplified illustration of a static random access memory (SRAM) structure.
Figure 2:
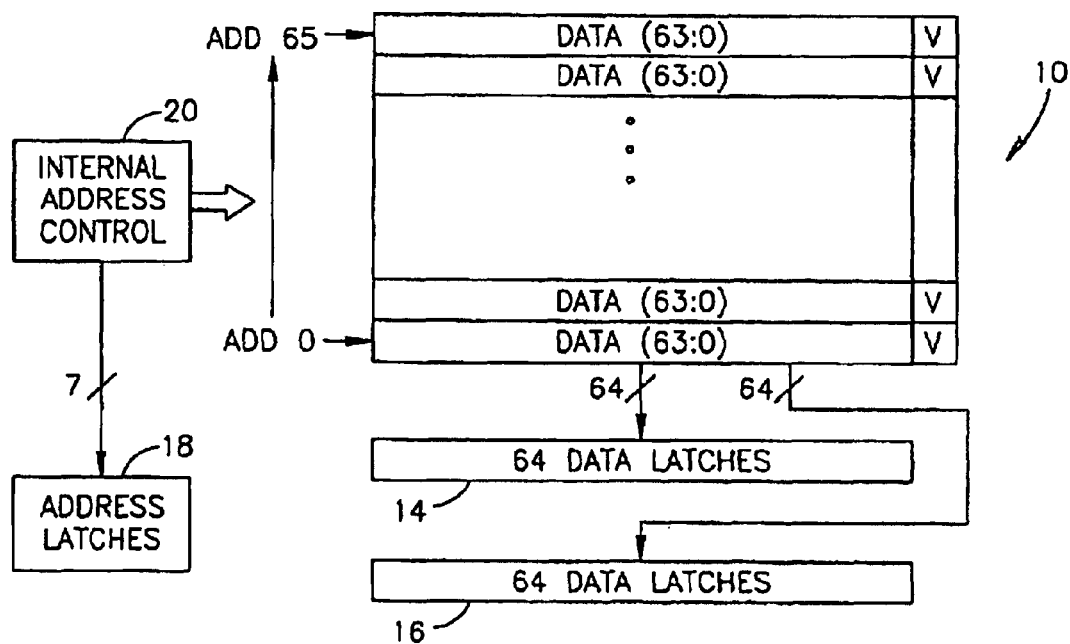
FIG. 2 is a simplified illustration of a look ahead implementation of the prior art for programming the SRAM of FIG. 1.
Figure 3:
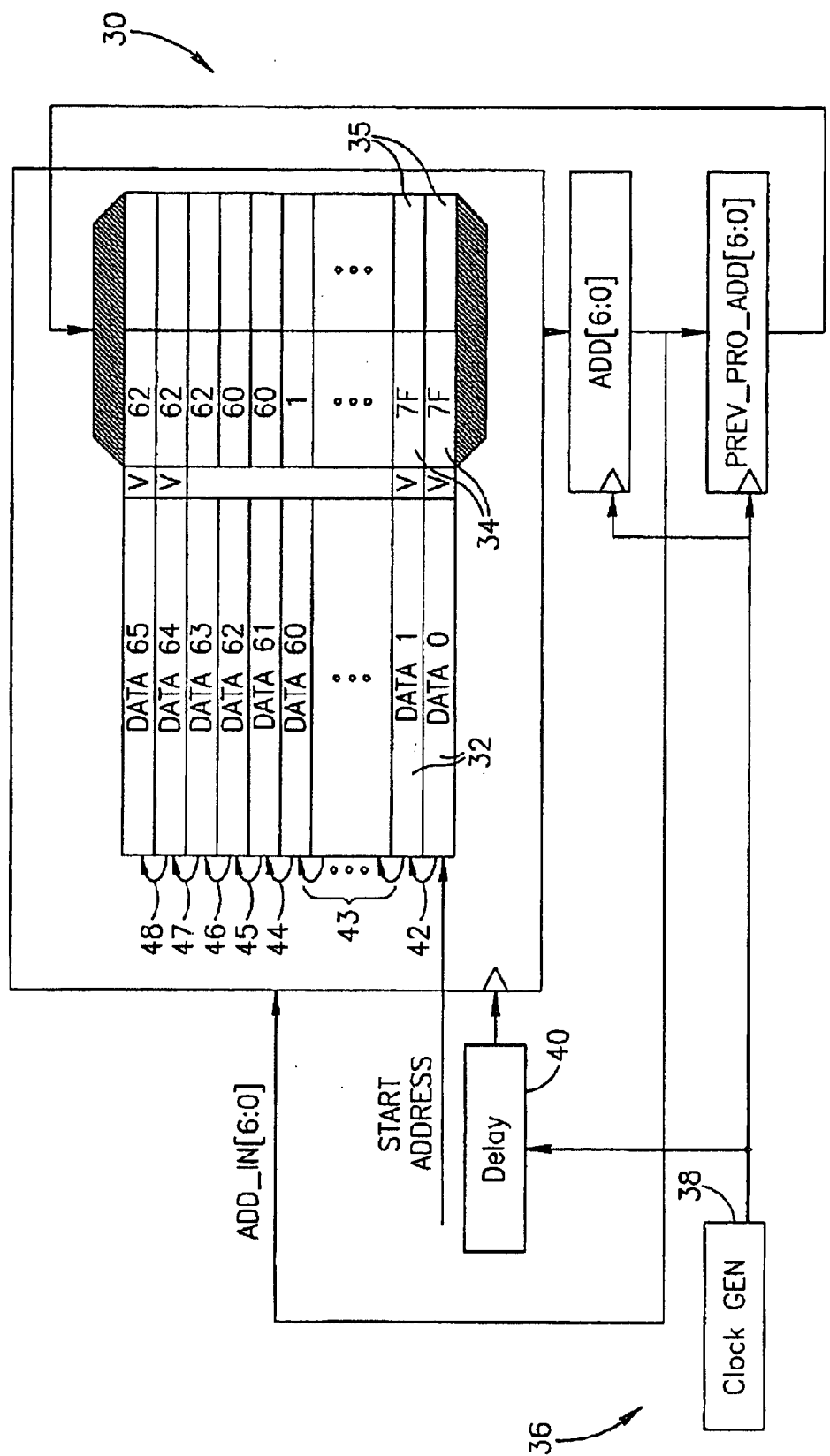
FIG. 3 is a simplified illustration of a look ahead method and apparatus for a RAM device (e.g., SRAM or DRAM), in accordance with a preferred embodiment of the present invention.

Reference is now made to FIG. 3, which illustrates a look ahead method and apparatus, in accordance with a preferred embodiment of the present invention.

In the present invention, a random access memory (RAM) device 30 preferably includes a plurality of addresses 32 for storing therein data, and one or more address pointers 34 dedicated to one or more of the addresses 32. RAM device 30 may comprise, without limitation, a static random access memory (SRAM) or a dynamic random access memory (DRAM) device, for example. Data in the addresses 32 may be accessed through data latches (not shown in FIG. 3) for performing operations, e.g., programming, on a memory cell array (not shown in FIG. 3).

In the illustrated embodiment, there are two address pointers, the left pointer being referred to as address pointer 34 and the right pointer being referred to as address pointer 35. A controller 36 is preferably provided that may control operation of the RAM device 30 and mark bits in the address pointers 34, as is described hereinbelow. Controller 36 may comprise, without limitation, a clock generator 38, delay circuitry or software 40 and processor circuitry or software.

One example of accessing data from RAM device 30 for performing an operation on the memory cell array is programming. Although the invention is not limited to programming, for the sake of clarity, the description will follow for programming. In a first mode of operation, controller 36 may scan the RAM device 30 address by address. For example, starting at an address labeled DATA0, the controller 36 looks for data that should be programmed in the array.

The controller 36 may use certain operations on the data addresses, such as "complex write" and "n-complex write", to decide if data should be programmed in the array. These operations are described in detail further hereinbelow.

In the illustrated example, DATA0 does not have data that should be programmed. (This means that the "complex-write" operation in DATA0 indicates to controller 36 that no data should be programmed in the array.) The controller 36 moves to the next address DATA1 (indicated by arrow 42). Here the controller 36 does find data to be programmed. (This means that the "complex-write" operation in DATA1 indicates to controller 36 that data should be programmed in the array.) The controller 36 preferably marks address pointer 34 on the same row as DATA1. The marking may comprise any suitable storage of a number or other data in the address pointer. It is noted that since there are 66 addresses, which may be represented by 7 bits, the address pointers 34 and 35, in this example, may have 7 bits, although the invention is not limited to these values.

The scanning continues through the addresses (arrows 43). In this example, no further addresses have data to be programmed until address DATA60. All the address pointers 34 corresponding to the addresses up to DATA60 are preferably marked with a "1", which flags the controller 36 that the previous address with data to be programmed (PREV_PRG_ADD) is address DATA1. The address pointer 34 corresponding to DATA60 is preferably marked as having data for programming and may also be marked with a "1", which again flags the controller 36 that the PREV_PRG_ADD is address DATA1.

The scanning continues to address DATA61 (arrow 44). Address DATA61 does not have data to be programmed. The address pointer 34 corresponding to address DATA61 is preferably marked with a "60", which flags the controller 36 that the previous address to be programmed (PREV_PRG_ADD) is address DATA60.

The scanning continues to address DATA62 (arrow 45). Address DATA62 has data for programming. The address pointer 34 corresponding to DATA62 is preferably marked as having data for programming and may also be marked with a "60", which flags the controller 36 that the PREV_PRG_ADD is address DATA60.

The scanning continues to address DATA63 (arrow 46). Address DATA63 does not have data to be programmed. The address pointer 34 corresponding to address DATA63 is preferably marked with a "62", which flags the controller 36 that the previous address with data to be programmed is address DATA62.

The scanning continues to address DATA64 (arrow 47). Address DATA64 does not have data to be programmed. The address pointer 34 corresponding to address DATA64 is preferably marked with a "62", as previously for DATA62.

The scanning continues to address DATA65 (arrow 48). Address DATA65 has data for programming. The address pointer 34 corresponding to DATA65 is preferably marked as having data for programming and may also be marked with a "62", which flags the controller 36 that the PREV_PRG_ADD is address DATA62.

Figure 4:
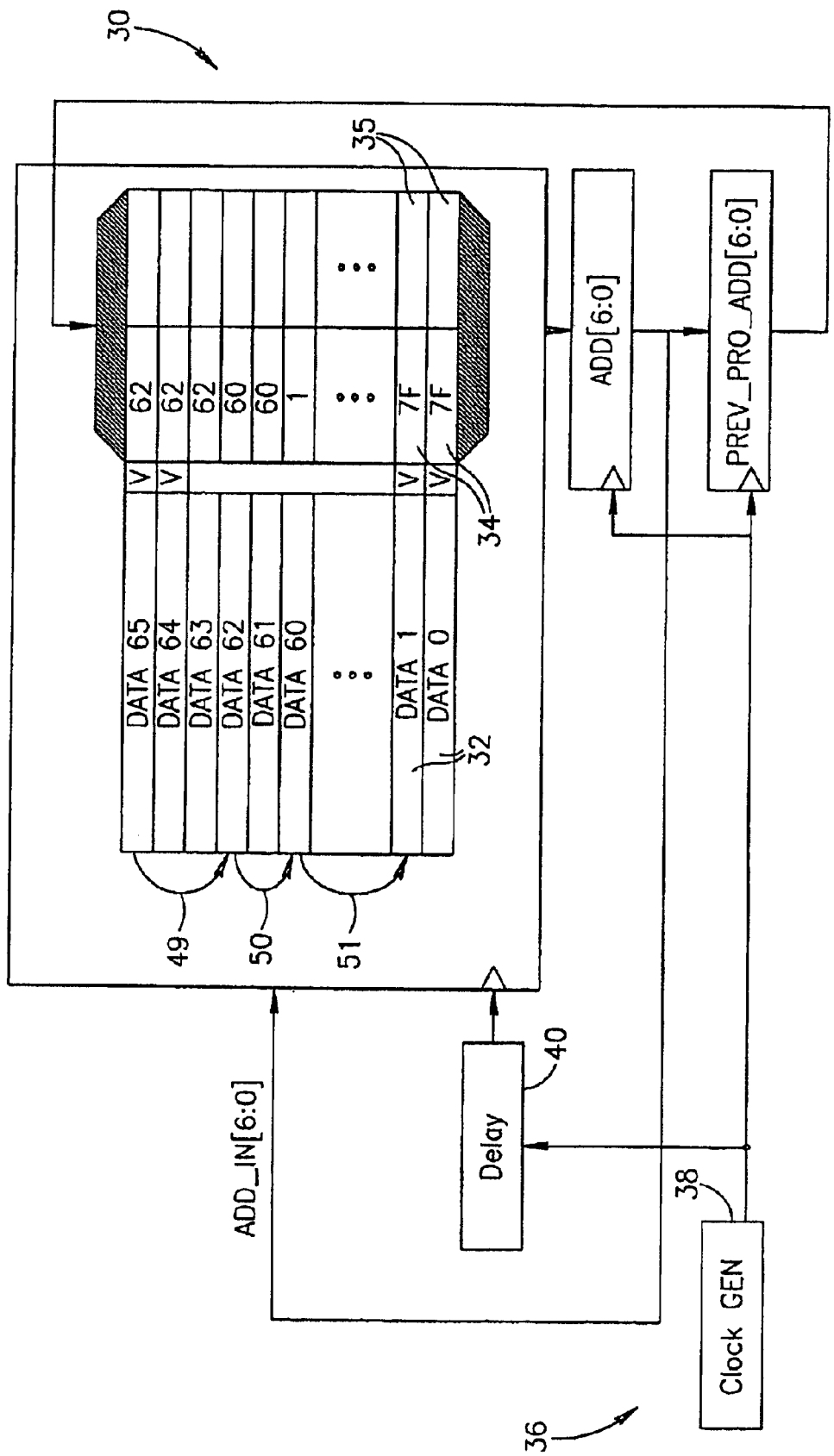
FIG. 4 is a simplified illustration of application of programming pulses to addresses of the RAM device of FIG. 3, in accordance with a preferred embodiment of the present invention.

Reference is now made to FIG. 4, which illustrates reading data from the RAM device 30 for application of programming pulses to the array (not shown), in accordance with a preferred embodiment of the present invention. The controller 36 may reverse scan through the RAM device 30 and retrieve data for programming only from those addresses whose address pointers 34 have been marked to indicate the presence of data for programming, and skip the other portions of the RAM device 30. This may provide a significant savings in programming time.

The controller 36 may start at address DATA65 and retrieve data from DATA65 to be programmed in the array. The controller at the same time may read the address pointer 34 associated with DATA65 and recognize that the next address with data to be programmed is DATA62. The controller may then skip addresses DATA64 and DATA63, as indicated by arrow 49, and proceed to DATA62 in order to retrieve data to be programmed in the array.

Once again, the controller may read the address pointer 34 associated with DATA62 and recognize that the next address with data to be programmed is DATA60. The controller may then skip address DATA61, as indicated by arrow 50, and proceed to DATA60 in order to retrieve data to be programmed in the array.

The controller may then read the address pointer 34 associated with DATA60 and recognize that the next address with data to be programmed is DATA1. The controller may then skip all of the addresses DATA59–DATA2, inclusive, as indicated by arrow 51, and proceed to DATA1 in order to retrieve data to be programmed in the array. The controller may then recognize that the programming may be terminated for now, because address DATA0 has not been indicated by the address pointer 34 of address DATA1 as having data to be programmed.

Figure 5:
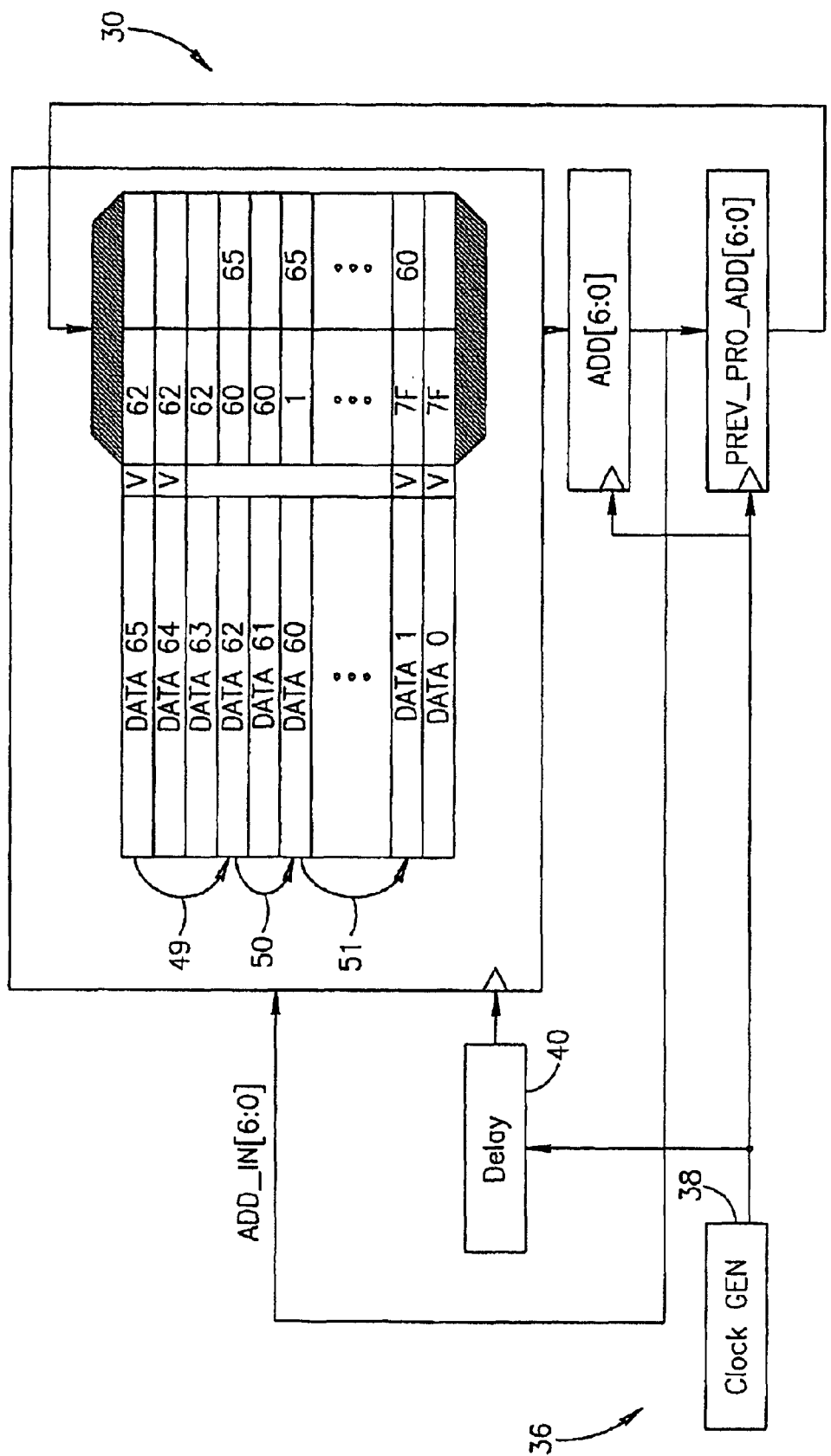
FIG. 5 is a simplified illustration of program verification of bits of the addresses of the RAM device of FIG. 3, in accordance with a preferred embodiment of the present invention.

Reference is now made to FIG. 5. After application of the programming pulses to the array (not shown), the bits of the array may be program verified in accordance with a preferred embodiment of the present invention. Program verification preferably comprises checking if the bits to be programmed have indeed reached a programmed state after application of the programming pulse. This checking preferably comprises interrogating the addresses of the RAM device 30 to verify if there is data that still needs to programmed in the array.

In accordance with a preferred embodiment of the present invention, the controller 36 may start at address DATA65 and verify if data in DATA65 should be programmed in the array. If DATA65 has data that still need to be programmed, then the controller 36 may mark the verification pointer 35 associated with DATA65 to indicate that another programming pulse should be applied to the array in accordance with the data in DATA65. The controller at the same time may read the address pointer 34 associated with DATA65 and recognize that the next address to be verified is DATA62.

The controller may then skip addresses DATA64 and DATA63, as indicated by arrow 49' (opposite in direction to arrow 49 in FIG. 4), and proceed to verify the data in DATA62. In the illustrated example, DATA62 has no data that needs to be programmed. The controller may then skip address DATA61, as indicated by arrow 50', and proceed to verify the data in DATA60.

If DATA60 has data that still needs to be programmed, then the controller 36 may mark the verification pointer 35 associated with DATA60 to indicate that another programming pulse should be applied to the array in accordance with the data in DATA60. The controller at the same time may read the address pointer 34 associated with DATA60 and recognize that the next address to be verified is DATA1. The controller may then skip addresses DATA59–DATA2, as indicated by arrow 51', and proceed to verify the data in DATA1. In the illustrated example, DATA1 has no data that need to be programmed.

Figure 6:
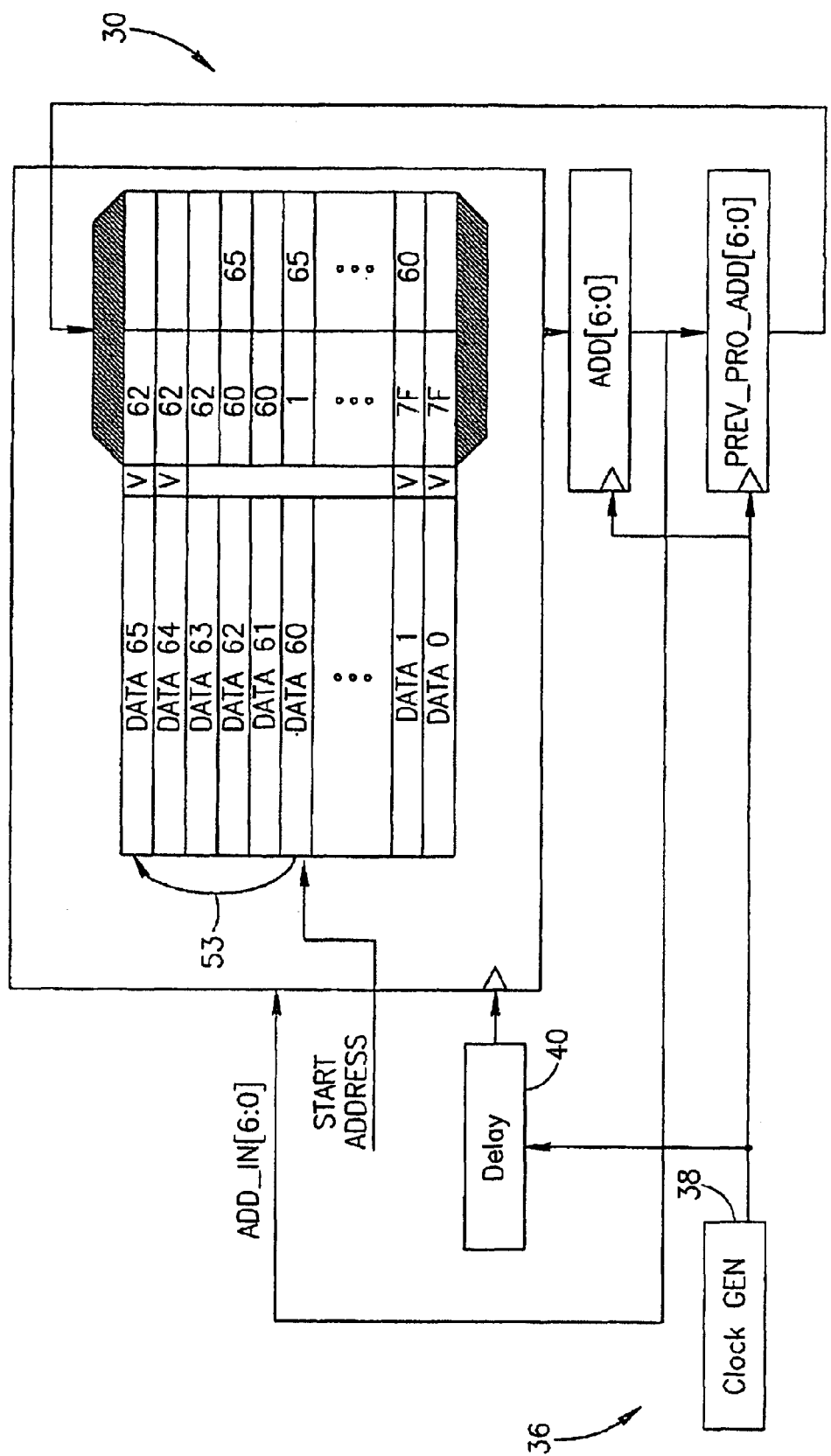
FIG. 6 is a simplified illustration of application of additional programming pulses to addresses of the RAM device of FIG. 3, in accordance with a preferred embodiment of the present invention.

Reference is now made to FIG. 6. After program verification, further programming pulses may be applied to the array (not shown). Controller 36 may scan through the verification pointers 35 and recognize which addresses still have data for further programming, and skip those addresses which do not have data for further programming. In the illustrated example, controller 36 may start at address DATA60 and, in accordance with the data of DATA60, apply one or more additional programming pulses to the array. The controller 36 reads the verification pointer 35 associated with address DATA60 and recognizes that the next address with data for further programming is DATA65. Accordingly, controller 36 may skip addresses DATA61–DATA64, as indicated by arrow 53, and proceed to DATA65.

It is appreciated that the procedure may continue until all bits of the array are successfully programmed.

It has been mentioned hereinabove that the controller 36 may employ operations on the addresses of the RAM device 30 to decide if data is to be programmed in the array. Two examples of operations include "complex write" (or "complex mode" or simply "complex") and "n-complex write" (or n-complex mode" or simply "n-complex"), which are now described in detail with reference to Tables A and B.

The complex mode is a type of Boolean operation performed on binary integers 0 and 1 that designate the programmed state of a bit to be programmed in the array and whether the RAM device 30 includes programming instructions for that bit. Specifically, when reading data from the array, the states of bits in the array are input in complex mode to RAM device 30. Binary integer 0 indicates that the bit is programmed, whereas binary integer 1 indicates that the bit is not programmed. Similarly, for each address in RAM device 30 that comprises data for writing to the array, binary integer 0 in the SRAM indicates that the bit should be programmed, whereas binary integer 1 indicates that the bit does not need to be programmed.

Accordingly, if an address in RAM device 30 corresponding to a particular bit in the array is 0, that means the bit in the array should be programmed. If the bit is indeed programmed, then the data from that bit input into the complex mode is binary 0. With an input of 0 from both the RAM device 30 and the array, the complex mode changes the bit in the RAM device 30 to 1, which instructs the controller 36 not to program the corresponding bit in the array over again, thus avoiding problems of overprogramming.

On the other hand, if the bit in the array was not programmed, then the data from that bit for the purposes of complex mode is binary 1. With an input of 0 from the RAM device 30 and 1 from the array, the complex mode keeps the bit in the RAM device 30 as 0, which instructs the controller 36 to program the corresponding bit in the array, which is the desired result.

Conversely, if the address in RAM device 30 corresponding to the bit in the array is 1, that means the bit in the array does not need programming. If the bit is indeed programmed, then the data from that bit input into the complex mode is binary 0. With an input of 1 from the RAM device 30 and 0 from the array, the complex mode keeps the bit in the RAM device 30 as 1, which instructs the controller 36 not to program the bit in the array, once again avoiding problems of over-programming. Similarly, if the bit in the array was not programmed, then the data from that bit for the purposes of complex mode is binary 1. With an input of 1 from both the RAM device 30 and the array, the complex mode keeps the bit in the RAM device 30 as 1, which instructs the controller 36 not to program the corresponding bit in the array, which is the desired result.

Truth Table A summarizes the complex mode.

Truth Table A

| RAM | Array | Complex Result (in RAM) | Action |
|---|---|---|---|
| 0 | 0 | 1 | No programming of bit in array |
| 0 | 1 | 0 | Program bit |
| 1 | 0 | 1 | No programming of bit in array |
| 1 | 1 | 1 | No programming of bit in array |

It may be seen that the complex mode corresponds to the following Boolean operation: (RAM) OR (NOT Array).

Once all the bits of RAM device 30 are 1, it is a sign that all bits which should be programmed are programmed, and no more programming will be performed.

After writing data to the array, certain blocks in the array may have failed, for whatever reason, to retain the programmed data. If the controller 36 is programmed such that the bits in the array were erased prior to programming, then the n-complex function of the RAM device 30 may be used to recover data that may have been lost and re-write the data to other blocks in the array.

One advantage of the n-complex mode is that there may be no need for a special buffer to store data for recovery operations. Rather the data that is already stored in the RAM device 30 may be used to recover the lost data in the array. Thus, if a user writes data to the array and receives a failure message, the n-complex mode may be used to recover the data quickly and efficiently.

The n-complex mode is another type of Boolean operation performed on the binary integers 0 and 1 corresponding to the programmed state of the bit and the RAM device 30 programming instructions for that bit. If the bit from the array is 0, it was previously 1, because as mentioned before, the assumption is that the controller 36 is programmed such that the bits in the arrays were erased prior to programming. Now that the bit is 0, the bit has been programmed and should be programmed if recovery action were to be taken. Accordingly, if the corresponding address in RAM device 30 is 1, the n-complex mode changes the RAM device address to 0, meaning the bit in the array should be programmed. In other words, in a recovery action, this will instruct the controller 36 to program the corresponding bit in the array, as is required. If the corresponding address in RAM device 30 is 0, the n-complex mode keeps the RAM device address as 0, again meaning the bit in the array should be programmed, as is required.

On the other hand, if the bit in the array is not programmed, then the data from that bit for the purposes of n-complex mode is binary 1. If the corresponding address in the RAM device 30 is 0, it is a sign that the bit in the array should have been programmed but failed for some reason. The n-complex mode then keeps the bit in the RAM device 30 as 0, which, in a recovery action, instructs the controller 36 to program the corresponding bit in the array, as is required. Conversely, if the address in RAM device 30 corresponding to the bit in the array is 1, that means the bit in the array does not need programming. With an input of 1 from both the RAM device 30 and the array, the n-complex mode keeps the bit in the RAM device 30 as 1, which instructs the controller 36 not to program the corresponding bit in the array, which is the desired result.

Truth Table B summarizes the n-complex mode.

Truth Table B

| RAM | Array | N-complex Result | Action |
|---|---|---|---|
| 0 | 0 | 0 | Program bit in recovery |
| 0 | 1 | 0 | Program bit in recovery |
| 1 | 0 | 0 | Program bit in recovery |
| 1 | 1 | 1 | No programming of bit |

It may be seen that the n-complex mode is a Boolean AND operation: (RAM) AND (Array).

It will be appreciated by person skilled in the art that the present invention is not limited by what has been particularly shown and described herein above. Rather the scope of the present invention is defined only by the claims that follow:

What is claimed is:

1. A method for operating a memory device, the method comprising:
    marking a portion of a memory device that comprises data associated with performance of an operation on a memory cell, wherein said memory device is a random access memory (RAM) device, said RAM device comprising a plurality of addresses for storing therein data; and wherein said marking further comprises:
        finding a first address by providing at least one address pointer for each of said addresses in said RAM device, said at least one address pointer comprising bits, and marking the bits of said at least one address pointer; and
        proceeding to a second address and marking the at least one address pointer that corresponds to said second address with an identifier that identifies said first address; and
    retrieving said data from said portion that is marked, and skipping retrieving data from at least one unmarked portion of said memory device in an operation cycle of said memory device.

2. The method according to claim 1 and further comprising retrieving data only from those addresses that have marked address pointers.

3. The method according to claim 2 and further comprising:
    finding a first address that comprises data for operating on said memory cell; and
    proceeding to a second address and marking at least one address pointer, referred to as a verification pointer, which corresponds to said second address, with an identifier that identifies said first address.

4. The method according to claim 3 wherein said marking said verification pointer comprises providing said memory device with at least two address pointers for each of said addresses in said RAM device, wherein one of said address pointers is dedicated for indicating from which addresses data is to be retrieved, and another of said address pointers comprises said verification pointer.

5. The method according to claim 4 and further comprising retrieving data only from those addresses that have marked verification pointers.

6. A memory device comprising:
   a random access memory (RAM) device comprising a plurality of addresses for storing therein data, and at least one address pointer for at least one of said addresses in said RAM device;
   a controller to mark bits in said at least one address pointer, wherein said controller is adapted to scan said RAM device address by address.

7. The memory device according to claim 6, wherein said RAM device communicates with an array comprising programmable bits, wherein said RAM device comprises a Boolean operation performable on binary integers 0 and 1 that designate a programmed state of a bit in said array (referred to as "ARRAY") and whether said RAM device includes programming instructions for said bit (referred to as "RAMs"), wherein binary integer 0 indicates that said bit is programmed, and binary integer 1 indicates that said bit is not programmed.

8. The memory device according to claim 7 wherein said Boolean operation comprises a "complex mode" function comprising the Boolean operation ("RAM") OR (NOT "ARRAY").

9. The memory device according to claim 7 wherein said Boolean operation comprises an "n-complex mode" function comprising the Boolean operation ("RAM") AND ("ARRAY").

\* \* \* \* \*